(12) United States Patent
Hansen et al.

(10) Patent No.: US 6,502,422 B1
(45) Date of Patent: Jan. 7, 2003

(54) METHOD FOR QUARTZ CRUCIBLE FABRICATION

(75) Inventors: Richard L. Hansen, Mentor, OH (US); Frederic F. Ahlgren, Richmond Heights, OH (US); Robert A. Giddings, Slingerlands, NY (US)

(73) Assignee: General Electric Company, Pittsfield, MA (US)

( * ) Notice: Subject to any disclaimer, the term of this patent is extended or adjusted under 35 U.S.C. 154(b) by 0 days.

(21) Appl. No.: 09/697,904

(22) Filed: Oct. 27, 2000

(51) Int. Cl.[7] ............................................. C03B 19/00
(52) U.S. Cl. ..................... 65/17.3; 65/17.1; 65/29.12; 65/29.15; 264/101; 264/102
(58) Field of Search ......................... 65/29.12, 29.15, 65/17.3, 17.1; 264/101, 102

(56) References Cited

U.S. PATENT DOCUMENTS 4,416,680 A * 11/1983 Brüning ...................... 65/17.3
4,897,100 A * 1/1990 Nice ...................... 65/DIG. 16
4,935,046 A * 6/1990 Uchikawa et al. ........... 65/17.4
5,082,484 A   1/1992 Koseki et al.
5,913,975 A   6/1999 Holder
6,136,092 A * 10/2000 Sato et al. .................... 65/17.1

FOREIGN PATENT DOCUMENTS

| EP | 0693461 | 1/1996 |
|----|---------|--------|
| JP | 1-157428 | 6/1989 |
| JP | 11199369 | 7/1999 |

\* cited by examiner

*Primary Examiner*—James Derrington

(57) ABSTRACT

A method for quartz crucible formation wherein an at least substantially enclosed chamber surrounds a crucible mold. The atmosphere in the chamber is controlled to include a desired gas or combination of gases at a positive pressure. The positive pressure is achieved because the total outflow of gas is less than the total inflow of gas. A heat source is initiated to melt a quartz material lining the mold once the desired atmosphere is achieved, and the quartz material is fused.

19 Claims, 1 Drawing Sheet

Gases being pulled into line to vacuum pump system

METHOD FOR QUARTZ CRUCIBLE FABRICATION

BACKGROUND OF THE INVENTION

The present invention is directed to quartz (alternatively referred to as silica) crucibles and more specifically to a method for forming fused quartz crucibles used in the semiconductor industry for growing single crystal silicon articles.

In the production of silicon crystals, the Czochralski method is often employed where polycrystalline silicon is first melted down within a quartz crucible. After the polycrystalline silicon has melted, a seed crystal is dipped into the melt and subsequently extracted while the crucible is rotated to form a single crystal silicon ingot.

It is important that the crucibles used for preparing single crystal silicon, particularly for the semiconductor industry, be essentially free of impurities. In addition, the quartz crucible is preferably largely free of included bubbles and other structural imperfections.

Accordingly, it is highly desirable to have available a method for forming silica crucibles having a low bubble content and/or bubbles containing gasses having little or no negative effect on silicon crystal growth.

Traditionally, to prepare such crucibles, a raw material quartz is introduced into a rotating hollow mold which has gas pervious wall regions at the side and bottom. After introducing the raw quartz material, a heat source is introduced into the mold to melt the quartz. During heating, a vacuum is applied to the outside of the rotating mold to draw out interstitial gases. Although this process reduces bubble content, bubbles nonetheless remain. Moreover, while attempts have been made to control the atmosphere, a satisfactory process does not exist to adequately meet the unique requirements of quartz crucible manufacture.

Therefore, a need still exists in the semiconductor industry for a crucible with a low bubble content and/or a crucible having bubbles containing gases with little destructive effect on the crystalline melt and the drawn crystal. This can be accomplished by reducing the number of bubbles and by controlling the composition of the gas trapped in the bubbles to reduce impact on crystal growth. Moreover, the composition of the gas in the bubbles can be controlled such that the included gas is highly soluble in the silicon melt and evolves therefrom. One important requirement to achieve this goal is the availability of a method for crucible manufacture which facilitates production of crucibles with reduced bubble count and with controlled bubble gas composition.

SUMMARY OF THE INVENTION

According to an exemplary embodiment of this invention, a method for the manufacture of quartz crucibles is provided. The method comprises providing an at least substantially enclosed chamber surrounding a crucible mold. The atmosphere in the chamber is controlled at a positive pressure wherein the total outflow of gas is less than the total inflow of gas. Once the desired atmosphere has been achieved, a heat source is provided (usually an arc) to melt a quartz material lining the inside of the mold, allowing the quartz material to fuse.

According to an alternative embodiment, a method for quartz crucible formation comprising controlling the atmosphere surrounding a crucible mold is provided. The atmosphere is controlled by replacing an ambient atmosphere with an atmosphere comprising desired gases. The outflow of the desired gases is monitored at a point after the desired gases have passed through the crucible mold. The crucible is fused after the desired gases have been identified in the monitoring step.

DETAILED DESCRIPTION OF THE PREFERRED EMBODIMENT

Figure 1:
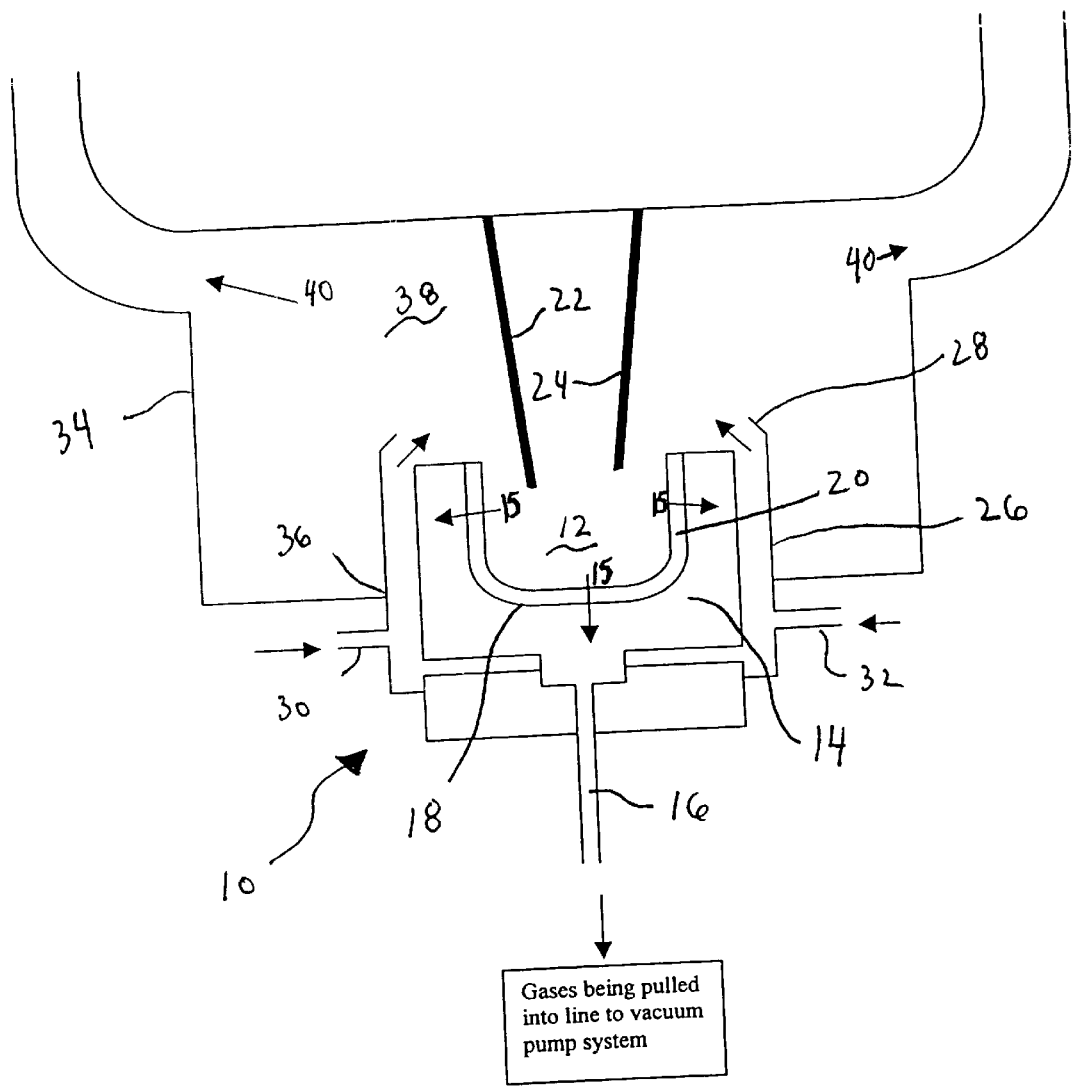
FIG. 1 is a schematic view of an apparatus for producing a crucible in accord with the present invention.

Fused quartz crucibles are used by the semiconductor industry for growing single crystal silicon ingots from polycrystalline silicon according to the Czochralski Process. In conducting the process, polycrystalline silicon is placed in a quartz crucible and melted at about 1500° C. The resulting melt is touched with a seed crystal. As it is pulled out, a single crystal silicon ingot grows.

During ingot growth, the molten silicon reacts with the fused quartz crucible, dissolving part of the crucible wall. If the crucible wall which dissolves contains bubbles, the dissolution process can cause the material surrounding the bubble to fragment. In so doing, fine chips of fragments of fused quartz may be released. Fragments which break off may cause multiple growth sites and upset the equilibrium of the crystal growth process, thus limiting the crystal growing yield. In addition, any gas contained within the bubble can be dissolved in the drawn silicon, or if insoluble, may become entrained therein. Accordingly, it is desirable to control the quantity, size and gas content of crucible bubbles.

The crucible itself is formed by placing quartz sand in a rotating graphite pot. Centrifugal forces cause the sand to "cling" to the sides of the pot, taking on the shape of a bowl. An electric arc supplies heat to melt the sand. When the arc is inserted, the temperature at the arc is about 6000° C., and the temperature at the wall is about 2000° C. A series of openings at the bottom of the graphite pot supply a vacuum to remove residual gases from the sand.

Not all gases between the sand grains are removed by the vacuum. Moreover, the spaces between the sand grains will retain some residual gas even at the available vacuum levels. In addition, the sand grains typically fuse together quickly, trapping gases in the voids. The gases roughly parallel the composition of the surrounding atmosphere. Previously, poor control of the surrounding atmosphere has been maintained during the fusion process. Similarly, earlier crucible forming process did not provide for effective monitoring and modification of the fusion atmosphere.

By fusing crucibles in an atmosphere with a reduced amount of undesirable gases, the number of bubbles can be reduced and the bubbles which form in the crucible voids can have a reduced content of undesirable gases. Thus, when fewer and smaller bubbles are released into the melt as the crucible dissolves during crystal growth, void defects in the crystal caused by undesirable gases are minimized or eliminated.

Referring to FIG. 1 there is shown an apparatus 10 which facilitates implementation of the present process directed to producing quartz crucibles. Apparatus 10 includes a fusion atmosphere 12. A rotatable mold 14 is provided with a rotating shaft 16. Rotating shaft 16 is preferably hollow or otherwise equipped with a vacuum line in communication with mold 14 to facilitate drawing fusion atmosphere 12 through the walls of mold 14. Moreover, mold 14 is provided with passages (not shown) but generally indicated by arrows 15. In the mold 14, there is a cavity 18 for forming a crucible 20. The mold 14 is rotated and heat sources 22 and 24 (electric arc) produce a high temperature atmosphere in the mold 14. A quartz powder is supplied to the cavity 18 through a feed (not shown) but disposed above the mold 14. The quartz powder is deposited on the inner surface of the mold 14, and fused to form crucible 20 with heat from heat sources 22 and 24.

The mold 14 may be provided with a cooling mechanism of a conventional type. The configuration and the size of the mold 14 may be approximately determined depending on the configuration and the size of the crucible to be produced. The mold 14 is made of a material having a satisfactory heat resistance and mechanical strength.

The fusion atmosphere 12 inside the mold 14 is highly controlled. Particularly, a shroud 26 is provided which surrounds the bottom and sides of mold 14. In addition, shroud 26 includes shoulder 28 which helps to direct a gas entering via inlet conduits 30, 32 into atmosphere 12.

Shroud 26 is itself partially surrounded by housing 34. Housing 34 forms a gas tight or at least positive pressure seal 36 with shroud 26 to establish a controlled atmosphere 38. Housing 34 also includes exhaust vents 40. Gas as directed from shoulder 28 and from atmosphere 38 can enter the mold 14 to form a desired fusion atmosphere 12. Advantageously, the gas is not directly injected into fusion atmosphere 12, which can negatively impact the heating currents and/or the walls of the developing crucible.

By providing the shroud with a set of gas inlet pipes and a preferably cylindrical shroud body around the rotating pot that is at least substantially sealed around the perimeter at its bottom edge, an appropriate gas atmosphere can be designed. In addition, the present invention allows high volume flow but at low linear velocities because the gas enters the fusion zone from the space between the shroud and the rotating mold. This space acts like a plenum and allows the gas to come in at a reduced velocity, and flow slowly as it works its way toward the top edge of the mold and toward the open mouth of the fusion atmosphere. The present apparatus reduces patches of vapor deposits on the inside surface of the crucible. Moreover, prior use of atmosphere controlling gasses via jets disrupted the surface of the forming crucible by forming vapor spots. By providing gas space confinement and relatively low rate gas flow the present device reduces vapor spots. Preferably, the flow into the fusion atmosphere will be more than the sum of all the out-flows from that same area.

The above-identified apparatus provides a system in which a controlled process can be practiced for the fusion of the quartz crucibles. More specifically, a fusion atmosphere is provided which allows undesirable gases to be minimized. In this context, the process comprises the replacement of an ambient atmosphere with the desired fusion atmosphere via the supply of a desired gas composition to the inner areas of the shroud and housing. Outlets are provided so that the positive pressure created by the inflowing desired gas composition can drive off residual ambient gas. In addition, the fusion atmosphere is drawn through the mold via the vacuum system, helping to further reduce ambient gas levels and to replace ambient gas trapped between sand grains with a more desirable gas. By maintaining sufficient gas inflow, a positive pressure exists in the system which prevents ambient gases from entering. It is desirable that flows in the system be controlled so that the in-flow is greater than all of the out-flows. This ensures that the area will be at a positive pressure and thus be more capable of establishing a controlled volume of the desired gas stoichiometry.

Preferably, all of the pertinent in-flows and out-flows are balanced. Moreover, the incoming gas flow is preferably in excess of the vacuum pumping flow rate and the hood exhaust rate. This establishes the desirable positive pressure area of the desired fusion atmosphere gas above the mold opening. In this context, initial purging of the system may comprise a relatively high desired gas inflow, but once a desired fusion atmosphere is obtained, the desired gas inflow can be reduced to a level sufficient to maintain the positive pressure which prevents ambient gas from entering the system. Once the desired level of control of the atmosphere is gained, the arc is struck and power supplied to the arc to cause the sand bed to heat up and begin to melt. Once the inner surface of the sand bed starts to melt, it starts to provide a seal against the continued flow of gas.

Because the gas from the controlled atmosphere is pulled into and through the sand bed, one can control the gas that is in the interstices between the sand grains by gaining control over the controlled air volume which is the feed supply to the gas in the sand bed.

The present process also advantageously identifies the correct time to initiate fusion. The piping just on the vacuum pump side of the mold makes a preferred location to monitor gas composition. Moreover, at that location, the gas composition that has actually been pulled through the sand bed can be monitored. More specifically, by including an apparatus for monitoring the fusion atmosphere, (e.g. a mass spectrometer) in the vacuum line, it can be determined when a desired fusion atmosphere exists, at which time a heat source (e.g., electric arc) can be initiated. Continued monitoring of the gas composition being withdrawn via the vacuum line also allows accurate inflow levels of desired gases to be maintained.

As the control gas is pulled into the sand bed, it starts to replace the normal ambient air and if a gas that is different than air is used, the gradual change from air composition to that of the selected gas composition can be monitored. The fact that there is a vacuum system behind the sand bed causes a negative pressure in the pot. The fusion atmosphere gas is pulled down into the mold and then through the sand bed causing a negative pressure. The vacuum is preferably less than 75,000 Pa, more preferably less than 15,000 Pa, and most preferably, less than 5,000 Pa. This atmosphere conversion can take anywhere from a few minutes to several depending on vacuum pumping rate, source flow rate and other flow rates. When these variables are satisfied, pure nitrogen, for example, can replace air in about 1 to 1.5 minutes, with the remnants of normal air being less than 10% to less than 2% of what remains within about 2 to 3 minutes.

One additional advantage of the present inventive process is that the desired gas composition for the fusion atmosphere can be relatively, rapidly modified. For example, it may be desirable to initiate fusion in a substantially nitrogen based atmosphere and complete fusion in a substantially nitrogen/argon/or air based fusion atmosphere.

As a further example, it is noted that helium is a relatively expensive gas. Since the fusing crucible is believed to form a generally gas impermeable skin upon melting, it may be desirable to replace helium with another gas once the substantially impermeable skin has formed. In addition, it may be desirable to modify the fusion atmosphere form an initial inert gas atmosphere to include certain "reactive" gas from the following list based on desires of the crucible user.

The gas choices may include, but are not limited to helium, hydrogen, oxygen, nitrogen, neon, argon, krypton, xenon, and of lesser desirability, fluorine, chlorine, bromine, radon, carbon monoxide, carbon dioxide and water vapor. The choices also include, but are not limited to mixtures of the above like: binary mixtures such a helium plus oxygen, helium plus nitrogen, nitrogen plus oxygen, helium plus neon, ternary mixtures such as helium plus oxygen plus nitrogen, neon plus oxygen plus nitrogen, etc.

By controlling the atmosphere around fusion, the following advantages can be gained.

1. Seasonal variations in air temperature and humidity can be eliminated.

2. The electric arc can be properly maintained. The plasma chemistry of the gas present can be chosen. Nitrogen, or mostly nitrogen is known to suppress arcs. Other gases like argon or helium enhance the arc stability by virtue of their lower first ionization potentials. Accordingly, the arc atmosphere can be rapidly tailored as necessary.

3. The mobility (diffusivity) of the gas mixture can be chosen. Since the gas or gases are being pulled through a porous sand bed, gases which have higher mobility through the sand bed are more likely to result in a fused bed with lower bubble density for any given set of conditions and perhaps smaller bubble sizes (volumes). A highly mobile gas should result in fused quartz with fewer bubbles and smaller bubbles than we would have from fusing under a less mobile gas. For example, by choosing Helium, one would have a gas with much higher diffusivity than normal air.

4. The oxidation potential of the gas can be chosen by the stoichiometry. Accordingly, the oxygen presence can be controlled to make the gas phase more or less oxidizing. This may have a significant effect on the part of the bubble structure that comes from the organic gas formers in or on the sand grains. This could also affect electrode consumption rate and the oxidation of the crucible surface.

5. The gas or mixed gases can, be chosen to satisfy customer requests and/or requirements such that the atmosphere chosen is most favorable for any micro-defects in the grown silicon crystal which is produced. For example, a crucible can be made with the nitrogen removed. Knowing that crystal pulling systems with silicon melts will form silicon nitrides or silicon oxynitrides which would then be incorporated into the growing silicon crystal. Preparing a crystal without any nitrides or oxynitrides may be advantageous to crystal pulling and to the crystal product.

EXAMPLES

Crucibles (22" and 24") were manufactured in an apparatus of FIG. 1 under a controlled atmosphere of N2+O2 with very little argon. Crucibles (22") were manufactured under nitrogen plus oxygen mix (with no argon) and achieved residual fractions of argon ranging from 0.352 to 0.014 for the test 22" crucibles. This residual fraction being the fraction which relates the argon level in gas environment for the test piece, versus the argon level in a normal air environment. Crucibles (24") were made under similar nitrogen plus oxygen mixes with little or no -argon present so the argon residual fraction could be determined. Argon residual fractions of 0.117 to 0.011 were found. Test crucibles under helium were also manufactured which showed that the presence of helium allows the size of the bubbles in the inner surface volume of the crucible to be reduced. Sample pieces from these test crucibles were vacuum sealed to simulate Czochralski's crystal pulling and it was found that the bubble exhibited much less growth in size than bubbles containing normally captured air.

In addition to the arc effects, the diffusion capability of the gases can be controlled by picking gases that are known to have high diffusivity. This could enable the vacuum system to be more effective at reducing the bubble density of the crucible in targeted regions.

The invention has been described with reference to a preferred embodiment. Obviously, modifications and alterations will occur to others upon a reading and understanding of the specification. It is intended to include all such modifications and alterations insofar as the come within the scope of the appended claims or the equivalence thereof.

We claim:

1. A method for quartz crucible formation comprising:
   a. providing an at least substantially enclosed chamber surrounding a crucible mold,
   b. controlling an atmosphere in said chamber at a positive pressure wherein the total outflow of gas is less than the total inflow of gas,
   c. initiating a heat source to melt a quartz material lining said mold, and
   d. allowing said quartz material to fuse,
   wherein a vacuum draws said gas through said quartz material and said mold.

2. The method of claim 1 wherein said heat source comprising an electric arc.

3. The method of claim 1 wherein the vacuum is less than about 75,000 Pa.

4. The method of claim 1 further comprising monitoring said gas drawn through said vacuum.

5. The method of claim 4 wherein said heat source is initiated after a desired gas composition is determined from said monitoring step.

6. The method of claim 1 wherein said gas is introduced through a plenum around said mold.

7. The method of claim 6 wherein said gas is introduced with high volume flow at low linear velocities.

8. The method of claim 1 wherein said inflowing gas replaces ambient air in said chamber.

9. The method of claim 8 wherein said inflowing gas is chosen from the group consisting of helium, hydrogen, oxygen, nitrogen, neon, argon, krypton, xenon, fluorine, chlorine, bromine, radon, carbon monoxide, carbon dioxide, water vapor, and mixtures thereof.

10. The method of claim 8 wherein at the time of initiating said heat source, said ambient air comprises less than about 10% of the atmosphere.

11. The method of claim 8 wherein at the time of striking said arc, said ambient air comprises less than about 2% of the atmosphere.

12. The method of claim 1 wherein the stoichiometry of said gas is controlled by controlling the inflow and outflow of said gas.

13. A method for quartz crucible formation controlling an atmosphere surrounding a crucible mold that is at least substantially enclosed in a chamber by:
   a. replacing an ambient atmosphere with an atmosphere comprising desired gases,
   b. monitoring the outflow of said desired gases at a point after said desired gases have passed through said mold, and
   c. fusing a quartz material in said mold,
   wherein a vacuum draws said gases through said quartz material and said mold.

14. The method of claim 13 further comprising changing the compounds comprising said desired gases after said fusing step has begun.

15. The method of claim 13 wherein said desired gases comprise two or more compounds and further comprising altering the ratios of said compounds after said fusing step has begun.

16. The method of claim 13 wherein said desired gases are chosen from the group consisting of helium, hydrogen, oxygen, nitrogen, neon, argon, krypton, xenon, fluorine, chlorine, bromine, radon, carbon monoxide, carbon dioxide, water vapor, and mixtures thereof.

17. The method of claims 13 wherein said atmosphere comprising desired gases is maintained at a positive pressure wherein the total outflow of said desired gases is less than the total inflow of said desired gases.

18. The method of claim 13 wherein said gas is introduced at high volume flow with low linear velocities.

19. The method of claim 13 wherein at the start of the fusing step said ambient atmosphere is less than about 10% of the controlled atmosphere.

* * * * *